(12) United States Patent
Liu

(10) Patent No.: US 7,705,659 B1
(45) Date of Patent: Apr. 27, 2010

(54) POWER REGULATOR CIRCUITRY WITH POWER-ON-RESET CONTROL

(75) Inventor: Ping-Chen Liu, Fremont, CA (US)

(73) Assignee: Altera Corporation, San Jose, CA (US)

( * ) Notice: Subject to any disclaimer, the term of this patent is extended or adjusted under 35 U.S.C. 154(b) by 199 days.

(21) Appl. No.: 11/824,838

(22) Filed: Jul. 2, 2007

(51) Int. Cl.
*G11C 5/14* (2006.01)
(52) U.S. Cl. ...................... 327/530; 327/143
(58) Field of Classification Search ......... 327/538–543, 327/143, 198, 530
See application file for complete search history.

(56) References Cited

U.S. PATENT DOCUMENTS

| | | | | |
|---|---|---|---|---|
| 4,797,584 | A * | 1/1989 | Aguti et al. ................. | 327/143 |
| 5,212,412 | A * | 5/1993 | Atriss et al. ................ | 327/143 |
| 5,371,709 | A | 12/1994 | Fisher et al. | |
| 5,637,991 | A | 6/1997 | Brown et al. | |
| 6,232,893 | B1 | 5/2001 | Cliff et al. | |
| 6,515,318 | B2 * | 2/2003 | Tsunai ........................ | 257/239 |
| 6,954,103 | B2 * | 10/2005 | Yamauchi et al. .......... | 327/540 |
| 6,979,983 | B2 * | 12/2005 | Yen et al. ................... | 323/274 |
| 7,151,656 | B2 | 12/2006 | Dvorak et al. | |
| 7,205,807 | B2 * | 4/2007 | Svensson et al. ........... | 327/170 |

OTHER PUBLICATIONS

U.S. Appl. No. 11/799,288, filed Apr. 30, 2007, Vest et al.

* cited by examiner

*Primary Examiner*—Quan Tra
(74) *Attorney, Agent, or Firm*—Treyz Law Group; G. Victor Treyz; David C. Kellogg

(57) ABSTRACT

Power regulator circuitry is provided for powering loads such as memory element arrays on integrated circuits. The power regulator circuitry may have a regulated power supply circuit and a switch-based power supply circuit. Control circuitry can control the regulated power supply circuit and the switch-based power supply circuit. The control circuitry may include a power supply power-on-reset control circuit. The power supply power-on-reset control circuit may receive a system power-on-reset control signal from a system power-on-reset control circuit. Based on the system power-on-reset control signal and monitored power supply voltages, the power supply power-on-reset control circuit may apply power-on-reset control signals to depletion mode transistors in the power regulator circuitry to ensure that nodes within the power regulator circuitry have defined values during power-up operations.

20 Claims, 12 Drawing Sheets

POWER REGULATOR CIRCUITRY WITH POWER-ON-RESET CONTROL

BACKGROUND

This invention relates to power regulator circuitry, and more particularly, to power regulator circuitry for powering volatile memory elements such as configuration random access memory elements.

Integrated circuits often contain volatile memory elements. Typical volatile memory elements are based on cross-coupled inverters (latches) and are used to store data. Each memory element can store a single bit of data.

Volatile memory elements are often used to store configuration data in integrated circuits. For example, volatile memory elements may be used to store configuration data in programmable logic device integrated circuits. Programmable logic devices are a type of integrated circuit that can be customized in relatively small batches to implement a desired logic design. In a typical scenario, a programmable logic device manufacturer designs and manufactures uncustomized programmable logic device integrated circuits in advance. Later, a logic designer uses a logic design system to design a custom logic circuit.

The logic design system uses information on the hardware capabilities of the manufacturer's programmable logic devices to help the designer implement the logic circuit using the resources available on a given programmable logic device.

The logic design system creates configuration data based on the logic designer's custom design. When the configuration data is loaded into the memory elements of one of the programmable logic devices, it programs the logic of that programmable logic device so that the programmable logic device implements the designer's logic circuit. The use of programmable logic devices can significantly reduce the amount of effort required to implement a desired integrated circuit design.

Conventional programmable logic device memory elements are powered at a constant positive power supply voltage. The positive power supply voltage that is used to power conventional programmable logic device memory elements is typically referred to as Vcc or Vcc-core and is the same power supply voltage used to power the core logic in the programmable logic device.

Integrated circuits such as programmable logic device integrated circuits that operate at low values of Vcc offer benefits over integrated circuits that operate at higher values of Vcc. For example, reductions in Vcc generally lead to reduced power consumption. Because of these benefits, the semiconductor industry is continually striving to produce processes and circuit designs that support reductions in Vcc. Previous generations of programmable logic devices operated at Vcc levels of 2.0 volts, 1.8 volts, and 1.5 volts. More recently, Vcc levels of 1.2 volts have been used in programmable logic devices. It is expected that future programmable logic devices will support Vcc levels of less than 1.2 volts (e.g., 1.1 volts or 1.0 volts).

The memory elements in a programmable logic device produce static output signals that reflect the configuration data that has been loaded into the memory elements. The static output signals drive the gates of n-channel and p-channel metal-oxide-semiconductor (MOS) transistors. Some of the transistors such as the n-channel transistors are used as pass transistors and are incorporated into multiplexers and other logic components. P-channel transistors are sometimes used as power-down transistors that prevent power from being applied to unused portions of an integrated circuit.

Both n-channel and p-channel transistors operate poorly when they are driven at insufficient voltages. For example, if the gate of an n-channel pass transistor receives a voltage that is too low, the transistor will not turn on properly and will degrade logic signals passing through the transistor. If the gate of a p-channel power-down transistor is too low, the transistor will not turn off properly and will exhibit an undesirably large leakage current.

Programmable memory element power supply voltages that are elevated with respect to the core logic power supply voltage on a programmable logic device may be used to improve performance. However, powering programmable memory elements with static elevated power supply voltages may adversely affect performance. For example, it may be difficult to load configuration data into such memory elements. As a result, a power supply for this type of memory element may need to operate at different voltage levels at different times. The power supply may, for example, be required to output one voltage during write operations and another voltage during normal operation. Such a power supply should not exhibit unacceptable surge currents during power-up operations and should not be susceptible to latch-up conditions.

It would be desirable to be able to provide power regulator circuitry that can exhibit good performance while meeting time-varying voltage supply requirements.

SUMMARY

In accordance with the present invention, power regulator circuitry is provided for powering loads such as arrays of programmable memory elements on integrated circuits such as programmable logic device integrated circuits. The power regulator circuitry may have a regulated power supply circuit and may have a switch-based power supply circuit. The regulated power supply circuit and switch-based power supply circuit may be connected to a common output line.

The power regulator circuitry may have a power supply power-on-reset control circuit. The power supply power-on-reset control circuit may produce power-on-reset control signals that are applied to active leaker transistors. The power-on-reset control signals turn on the active leaker transistors during power-up operations to ensure that nodes in the regulated power supply circuit and switch-based power supply circuit are held at defined voltages.

Further features of the invention, its nature and various advantages will be more apparent from the accompanying drawings and the following detailed description.

DETAILED DESCRIPTION

Figure 1:
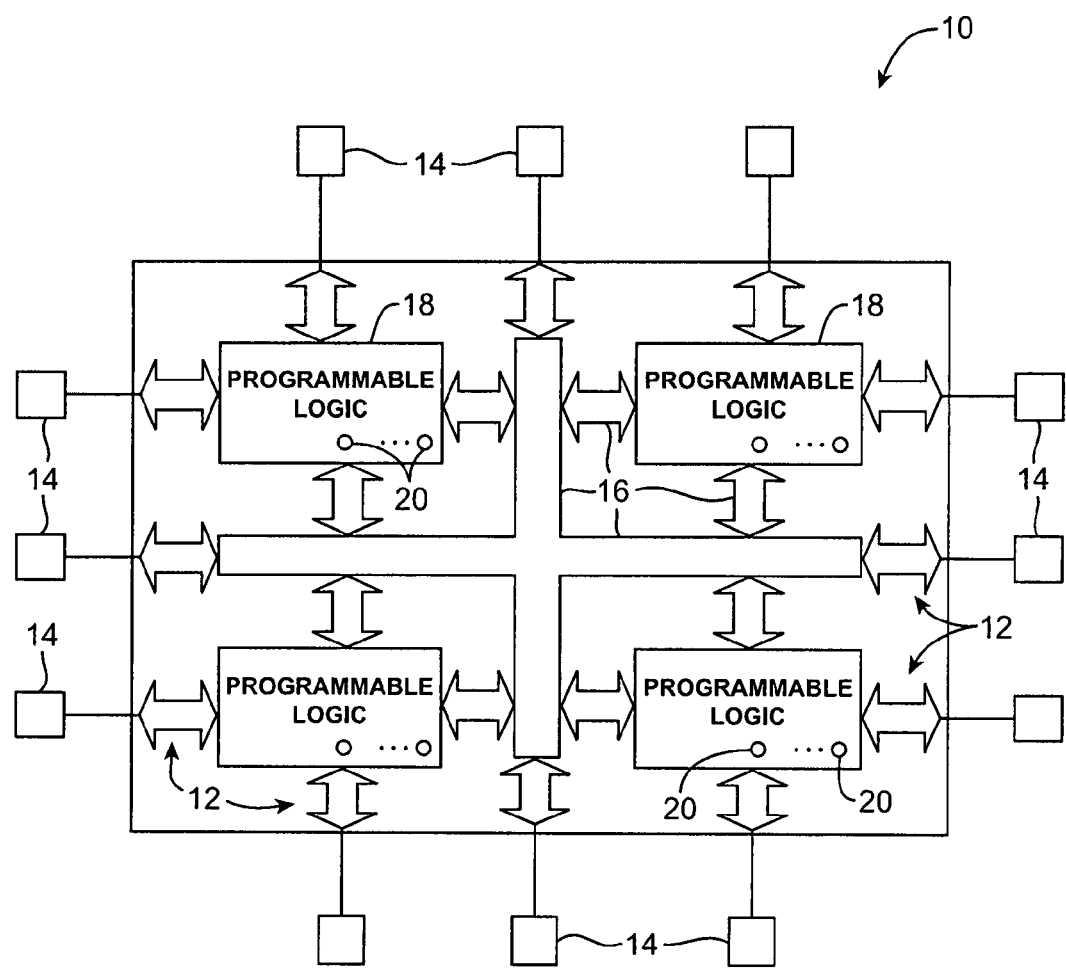
FIG. 1 is a diagram of an illustrative programmable logic device integrated circuit that may have power regulator circuitry for powering programmable logic device memory elements in accordance with an embodiment of the present invention.

The present invention relates to power regulator circuitry (also sometimes referred to as power supply circuitry or voltage regulator circuitry). In particular, the invention relates to power regulator circuitry that may be used to power memory elements in integrated circuits. The integrated circuits that contain the power regulator circuitry may be memory chips, digital signal processing circuits with memory arrays, microprocessors, application specific integrated circuits with memory arrays, programmable logic device integrated circuits in which memory elements are used for configuration memory, or any other suitable integrated circuits. For clarity, the present invention will generally be described in the context of programmable logic device integrated circuits in which programmable logic device memory elements are used to store configuration data and in which the regulator circuitry is used to provide power supply voltages for the memory elements.

During the programming of a programmable logic device, configuration data is loaded into the memory elements. During operation of the programmable logic device, each memory element provides a static output signal. The outputs signals from the memory elements are applied to programmable logic and customize the programmable logic to perform a desired logic function. In a typical arrangement, each static output signal serves as a control signal that is applied to the gate of an n-channel or p-channel metal-oxide-semiconductor transistor.

The programmable logic in which the n-channel and p-channel transistors are contained makes up part of the logic core of the programmable logic device and is therefore sometimes referred to as programmable core logic. Core logic is powered using a positive power supply voltage that is sometimes referred to as Vccd and a ground voltage that is sometimes referred to as Vss.

To reduce power consumption, there is an ongoing trend in the semiconductor industry to reduce the magnitude of core logic power supply voltages. Reducing the core logic power supply voltage on a chip reduces power consumption, but can lead to design challenges. For example, n-channel transistors in the programmable core logic can be difficult to turn on completely and p-channel transistors in the core logic can be difficult to turn off completely.

In accordance with the present invention, power regulator circuitry may be used to produce power supply voltages for the programmable memory elements on a programmable logic device integrated circuit. Each memory element may include a storage element formed from cross-coupled inverters. Each memory element may also include an address transistor and a clear transistor. During configuration data loading operations, the address transistors in the programmable logic device memory elements may be powered at an elevated power supply voltage (e.g., a voltage of 1.55 volts) and the storage elements in the programmable logic device memory elements may be powered at a lower power supply voltage such as Vccd. After the configuration data loading operations are complete, the power regulator circuitry can produce an elevated power supply voltage (e.g., a voltage Vccr of 1.55 volts) for powering the storage elements in the programmable logic device memory elements.

The power supply voltage that is used to power the address transistors in the programmable logic device memory elements may sometimes be referred to as an address transistor power supply voltage (Vccadd). Any suitable values may be used for the minimum and maximum voltage levels for Vccadd. With one suitable arrangement, the value of Vccadd may range from a low voltage of Vccd (e.g., 1.2 volts) to a high voltage of Vccr (e.g., 1.55 volts or another voltage in the range of about 1.5-1.7 volts). Arrangements involving a fixed value of Vccadd may also be used.

The power supply voltage that is used to power the storage elements in the programmable logic device integrated circuit is sometimes referred to as a storage element power supply voltage. The power regulator circuitry supplies an output voltage Vccout at its output that serves as the storage element power supply voltage. Initially, during power-up operations, the voltage Vccout is held low at Vss (e.g., 0 volts). This ensures that the storage elements are turned off, so that the outputs of the storage elements do not unexpectedly turn on pass transistors or other components during power up. Following power-up, clear operations are performed. During clear operations, the value of Vccout may be held at a low positive voltage (e.g., 0.3 volts). During write operations, when data is being loaded into the memory elements, the value of Vccout may be Vccd (e.g., 1.2 volts). After configuration data has been loaded into the memory elements to program the programmable logic device to implement a desired logic function, the value of Vccout may be elevated to Vccr (e.g., 1.55 volts). In this mode of operation, which is sometimes referred to as user mode, the programmable logic device may be used in a system. During user mode, the elevated voltage output signals from the memory elements are applied to associated devices (e.g., pass transistors) to configure the programmable logic on the programmable logic device so that it performs its desired circuit functions.

The power regulator circuitry that is used to provide the power supply voltage Vccout may include two functional blocks of power supply circuitry: a regulated power supply circuit and a switch-based power supply circuit. These blocks may be physically intermingled with each other on a chip.

When operating the power regulator circuitry so that the voltage output Vccout is at the voltage Vccd, the switch-based power supply circuit may be turned on and the regulated power supply circuit may be turned off. In this mode of operation, power may be routed to the memory elements from an external power supply source through a digital switch in the switch-based power supply circuit. A digital switch of this type may contain multiple sets of transistors that are connected in parallel to increase the capacity of the digital switch circuit. Each set of transistors may, as an example, be formed from a pair of series-connected p-channel metal-oxide-semiconductor transistors.

When it is desired to increase the magnitude of Vccout to support user mode operations, the switch-based power supply circuit may be turned off and the regulated power supply circuit may be turned on. In this mode of operation, analog voltage regulation circuitry in the regulated power supply circuit may be used to supply Vccout. The analog voltage regulation circuitry may include a power transistor, a feedback path that feeds back the output voltage, and an operational amplifier. The operational amplifier may compare a reference voltage to the value of the signal that is fed back over the feedback path and may produce a corresponding control signal for the gate of the power transistor. To increase the power handling capability of the power transistor, the power transistor may be implemented using multiple parallel power transistor devices. These power transistor devices may be arranged in a ring around an array of storage elements. The pairs of series connected p-channel metal-oxide-semiconductor transistors in the digital switch may also be provided in a ring around the array of storage elements.

If proper care is not taken during power-up operations, power regulator circuitry might experience current surges. Moreover, transistors in the power regulator circuitry (e.g., p-channel metal-oxide-semiconductor transistors in a switch-based power supply circuit) might be susceptible to latch-up.

In accordance with the present invention, problems such as these may be avoided using power-on-reset circuitry that ensures that signal voltages in the power regulator circuitry are well controlled during power up. Depletion mode transistors may serve as active leakers that hold the voltages at certain nodes in the power regulator circuitry at desired known voltages.

An illustrative programmable logic device 10 that may contain power regulator circuitry in accordance with the present invention is shown in FIG. 1.

Programmable logic device 10 may have input/output circuitry 12 for driving signals off of device 10 and for receiving signals from other devices via input/output pins 14. Interconnection resources 16 such as global and local vertical and horizontal conductive lines and buses may be used to route signals on device 10. Interconnection resources 16 include fixed interconnects (conductive lines) and programmable interconnects (i.e., programmable connections between respective fixed interconnects). Programmable logic 18 may include combinational and sequential logic circuitry. The programmable logic 18 may be configured to perform a custom logic function. The programmable interconnects associated with interconnection resources may be considered to be a part of programmable logic 18.

Programmable logic device 10 contains volatile memory elements 20 that can be loaded with configuration data (also called programming data) using pins 14 and input/output circuitry 12. Once loaded, the memory elements each provide a corresponding static control output signal that controls the state of an associated logic component in programmable logic 18. Typically the memory element output signals are used to control the gates of metal-oxide-semiconductor (MOS) transistors. Most of these transistors are generally n-channel metal-oxide-semiconductor (NMOS) pass transistors in programmable components such as multiplexers. When a memory element output is high, the pass transistor controlled by that memory element is turned on and passes logic signals from its input to its output. When the memory element output is low, the pass transistor is turned off and does not pass logic signals. P-channel metal-oxide-semiconductor (PMOS) transistors may also be controlled by the memory elements.

A typical memory element 20 has a storage element portion that is formed from a number of transistors configured as cross-coupled inverters. With one suitable approach, complementary metal-oxide-semiconductor (CMOS) integrated circuit technology is used to form the memory elements 20, so CMOS-based memory element implementations are described herein as an example. In the context of programmable logic device integrated circuits, the memory elements store configuration data and are therefore sometimes referred to as configuration random-access memory (CRAM) cells.

The memory elements may be loaded from any suitable source. With one illustrative arrangement, the memory elements are loaded from an external erasable-programmable read-only memory and control chip called a configuration device via pins 14 and input/output circuitry 12. The output signals from the loaded memory elements 20 are applied to the terminals (e.g., gates) of circuit elements (e.g., metal-oxide-semiconductor transistors) in programmable logic 18 to control those elements (e.g., to turn certain transistors on or off) and thereby configure the logic in programmable logic 18. The circuit elements may be transistors such as pass transistors, parts of multiplexers, look-up tables, logic arrays, AND, OR, NAND, and NOR logic gates, etc. The memory elements 20 are generally arranged in an array pattern. In a typical modern programmable logic device, there may be millions of memory elements 20 on each chip.

The circuitry of device 10 may be organized using any suitable architecture. As an example, the logic of programmable logic device 10 may be organized in a series of rows and columns of larger programmable logic regions each of which contains multiple smaller logic regions. The logic resources of device 10 may be interconnected by interconnection resources 16 such as associated vertical and horizontal conductors. These conductors may include global conductive lines that span substantially all of device 10, fractional lines such as half-lines or quarter lines that span part of device 10, staggered lines of a particular length (e.g., sufficient to interconnect several logic areas), smaller local lines, or any other suitable interconnection resource arrangement. If desired, the logic of device 10 may be arranged in more levels or layers in which multiple large regions are interconnected to form still larger portions of logic. Still other device arrangements may use logic that is not arranged in rows and columns.

Figure 2:
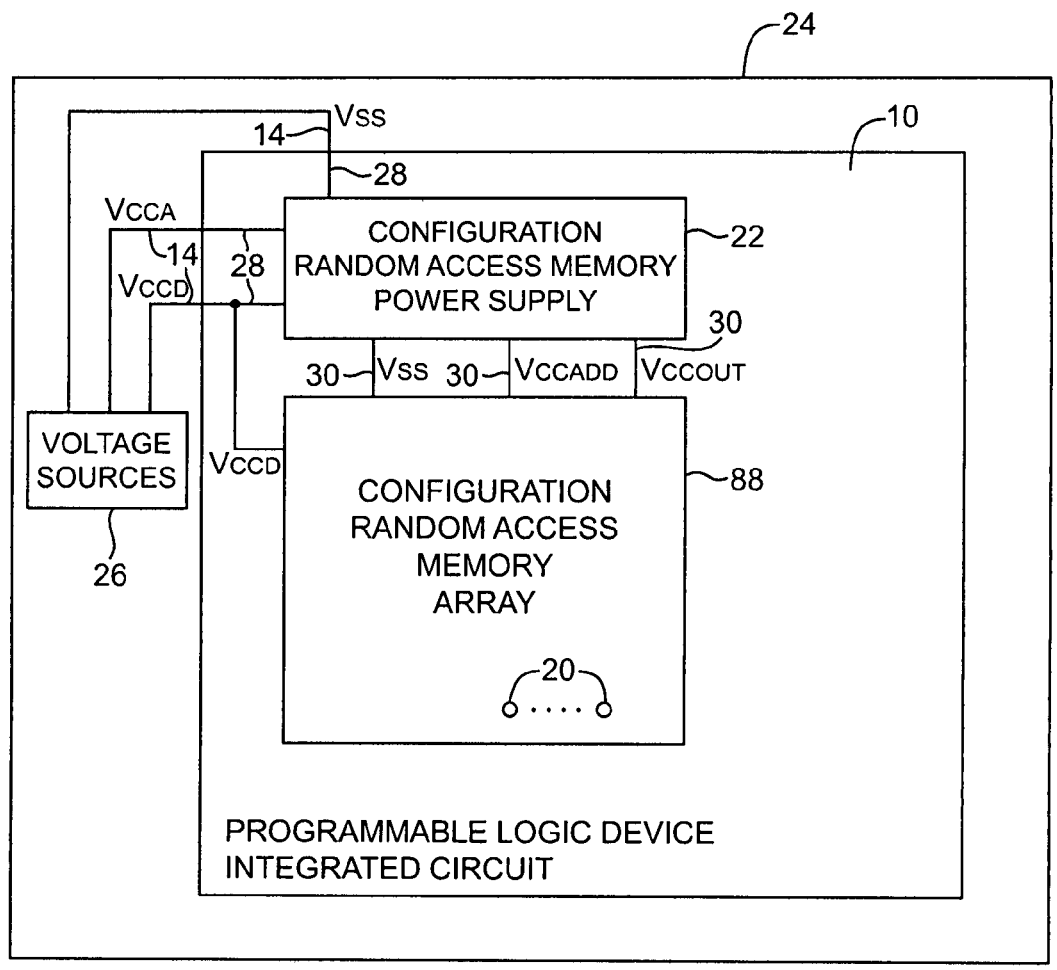
FIG. 2 is a diagram of an illustrative programmable logic device integrated circuit having configuration random access memory and a configuration random access memory power supply in accordance with an embodiment of the present invention.

As shown in FIG. 2, programmable logic device 10 may be mounted on a board 24 or other mounting structure in a system. External voltage sources such as voltage sources 26 may be located on board 24 or another board or portion of the system and may be used to supply power supply voltages such as Vss (e.g., 0 volts), Vcca (e.g., 2.5 volts), and Vccd (e.g., 1.2 volts) to programmable logic device 10 via pins 14.

Configuration random access memory power supply 22 may receive voltages Vss, Vcca, and Vccd as inputs on input paths such as paths 28. Configuration random access memory power supply 22 may supply corresponding power supply voltages Vss, Vccadd, and Vccout on output paths such as paths 30. The power supply voltage Vccadd may be used to power address drivers. The address drivers may supply address signals to address transistors in the programmable memory element cells 20 in array 88 via address lines. The power supply voltage Vccout may be used to power cross-coupled inverters in programmable memory element cells 20 in configuration random-access memory array 88.

Figure 3:
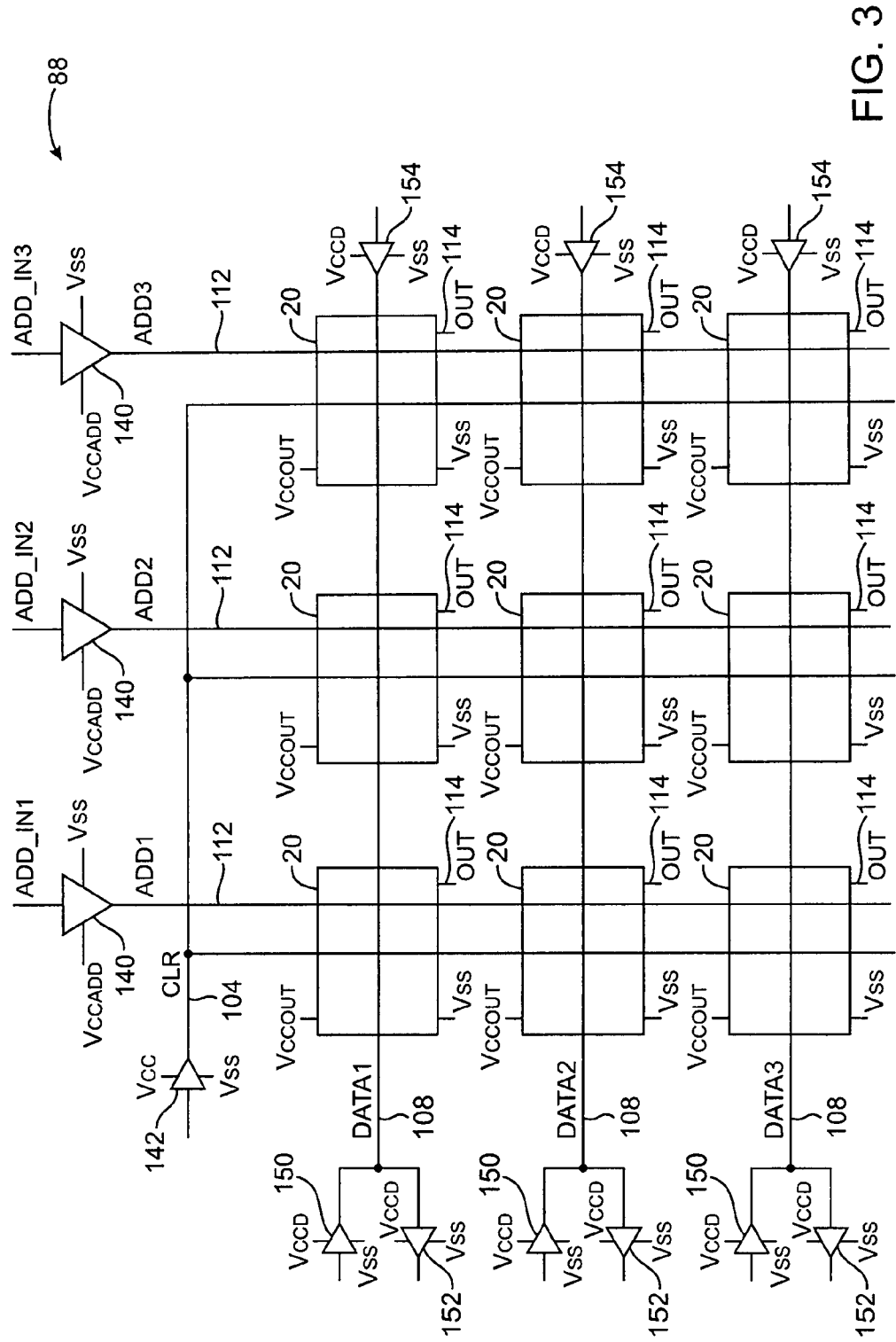
FIG. 3 is a diagram of an array of programmable logic device memory elements that may be powered using power regulator circuitry in accordance with an embodiment of the present invention.

Horizontal and vertical conductors and associated loading circuitry may be used to load the memory elements 20 in array 88 with configuration data. An illustrative array 88 of memory elements 20 is shown in FIG. 3. Address lines 112 are used to address array 88 as data is conveyed over data lines 108. Each address line 112 may have an associated address line driver 140. Drivers 140 may be powered with positive power supply voltage Vccadd and ground power supply voltage Vss (e.g., 0 volts). Each driver 140 may receive an address signal ADD_IN at its input and may produce a corresponding address signal ADD for one of lines 112 at its output.

Configuration data may be loaded into memory elements 20 in array 88 over data lines 108 as appropriate address lines 112 are asserted. Data input buffers 150 may be used to drive data onto lines 108 during write operations. During read operations, data may be read out of cells 20 via data lines 108 and read buffers 152. Precharge drivers 154 may be used to charge lines 108 to a predetermined voltage prior to read and write operations. Drivers 150, 152, and 154 may be powered at positive power supply voltage Vccd and ground power supply voltage Vss.

A clear signal CLR on clear line 104 may be used to clear the memory elements 20 in preparation for data loading operations. The clear signal CLR may be produced by a clear line driver 142 that is powered using positive power supply voltage Vccd and ground voltage Vss. If desired, array 88 may be cleared by powering up memory elements 20 to a low voltage Vccclr (e.g., 0.3 volts) while clear signal CLR is held high at Vccd. Each memory element 20 produces an output on a corresponding data output line 114.

Programmable logic device 10 contains core logic (e.g., hardwired logic and programmable logic 18 of FIG. 1). The core logic may be powered at positive power supply voltage Vccd and ground voltage Vss. Power regulator circuitry 22 (FIG. 2) may be powered using core logic power supply voltage Vccd, ground voltage Vss, and positive power supply voltage Vcca (e.g., a voltage that is larger than Vccd). With one suitable arrangement, Vccd may be 1.2 volts, Vss may be 0 volts, and Vcca may be 2.5 volts. Other arrangements may be used. For example, Vccd may be greater than or less than 1.2 volts, Vcca may be greater than or less than 2.5 volts, and Vss may be greater than or less than 0 volts. The use of a Vccd value of 1.2 volts, a Vcca value of 2.5 volts, and a Vss value of 0 volts is merely illustrative.

Power supply voltages such as Vccd, Vcca, and Vss may be supplied to circuitry on device 10 using any suitable arrangement. For example, power supply voltages such as Vccd, Vcca, and Vss may be received from one or more external power supply pins as shown in FIG. 2. Power supply voltages that are greater or less than the externally-supplied power supply voltages can be generated using on-chip circuitry. For example, a voltage divider may be used to reduce an externally-supplied voltage and a charge pump or other voltage boosting circuit may be used to generate a power supply voltage that is greater than an externally-supplied power supply voltage.

Data loading and reading circuitry on device 10 may be used to provide address, clear, and data signals to array 88. During writing operations, configuration data that is to be loaded into array 88 is supplied to data lines 108. During normal operation (user mode), the signals on output lines 114 are used to control associated programmable logic components.

The core logic on device 10 contains n-channel and p-channel metal-oxide-semiconductor transistors and programmable logic components formed from n-channel and p-channel metal-oxide-semiconductor transistors such as inverters, multiplexers, logic gates, register logic, look-up tables, etc. In a typical scenario, a circuit or component in programmable logic 18 has a positive power supply terminal that receives positive power supply voltage Vccd and a ground power supply terminal that receives ground power supply voltage Vss.

Power regulator circuitry 22 supplies ground power supply voltage Vss and positive power supply signals Vccadd and Vccout to the drivers and memory elements 20 of array 88. During normal operation, the value of Vccout is held at a voltage Vccr that is greater than Vccd (e.g., at a Vccr value of 1.55 volts). When the power supply voltage is elevated in this way (i.e., when the difference between the positive power supply voltage Vccr and the ground voltage Vss is larger than the difference between Vccd and Vss), the performance of the device 10 is enhanced. In particular, using an elevated power supply voltage makes it possible for the output control signals OUT from the memory elements 20 to more fully turn on n-channel transistors in the core logic of device 10 and to more fully turn off p-channel transistors in the core logic of device 10 than would otherwise be possible.

In general, an elevated power supply voltage may be implemented using an increased positive power supply voltage and/or a decreased ground power supply voltage. The introduction of power supply lines with different voltage levels into a programmable logic device architecture tends to add complexity. To avoid adding unnecessary complexity, it is may be desirable to limit the use of different power supply voltages. One suitable approach for limiting the number of power supply levels is to use the same ground voltage Vss to power array 88 that is used to the core logic and regulator circuitry on device 10. This type of arrangement is described as an example. If desired, however, other arrangements such as those in which the ground voltage for array 88 differs from the ground voltage for core logic 18 or the regulator circuitry may be used.

Power supply voltages Vccout, Vccadd, and Vss may be distributed to drivers 140 and memory elements 20 in memory element array 88 using any suitable scheme. For example, power supply voltage Vccout may be distributed to the memory elements in array 88 using a power distribution grid having interconnected columns and rows of power lines. In the example of FIG. 3, there are three rows and three columns of memory elements 20 in array 88. This is merely illustrative. Integrated circuits such as integrated circuit 10 may have any suitable number of memory elements 20. A typical memory array might, as an example, have thousands or millions of memory elements 20 arranged in hundreds or thousands or rows and columns.

The signal Vss is constant. The power supply signal Vccout preferably varies. For example, signal Vccout may vary between Vccd during write operations (where the relatively low voltage makes it easier to load data into elements 20) and Vccr during read operations (in which the relatively higher voltage makes it easier to ascertain the voltage levels on data lines 108). Use of a Vccout level equal to Vccr during normal operation may improve the performance of device 10. The power supply signal Vccadd may vary or may be constant. The power supply signal Vccadd may, as an example, vary between Vccr during write operations (where the increased voltage Vccr makes it easier to load data through the address transistors in elements 20) and Vccd during read operations (e.g., when reading data out of array 88 for testing).

Data loading and reading circuitry on device 10 controls clearing and data loading operations for array 88. The data loading and reading circuitry receives configuration data from external sources. In a typical system, configuration data is loaded into a programmable logic device from a memory and data loading circuit. This type of circuit, which is sometimes referred to as a configuration device, loads configuration data into registers within the data loading and reading circuitry. The data loading and reading circuitry produces clear signals on clear path 104 (labeled CLR). Asserting the signal CLR when powering up cells 20 clears the contents of the memory array 88. Clearing operations may be performed upon system power-up or during subsequent reconfiguration operations. After the array has been cleared, the CLR signal is deasserted and the configuration data is loaded.

Configuration data may be loaded into registers in the loading and reading circuitry. The registers may be used to apply the configuration data in parallel to array 88 via the DATA1, DATA2, and DATA3 lines 108. Address decoder circuitry may receive addressing information from an external source and, in response, may systematically assert and deassert desired address lines 112 (i.e., ADD1, ADD2, or ADD3). As the address line in each column is asserted, the data on the data lines 108 is loaded into the memory elements 20 in that column. By addressing each column in this way, the entire array 88 may be loaded with configuration data.

After the array has been loaded, proper data loading can be confirmed by reading out the data that has been programmed into memory elements 20. This operation, which is sometimes referred to as data confirmation, is used to ensure that no errors have occurred during the loading process. If the values of the confirmation data read out from array 88 do not match the values that were used during data loading, an error message may be generated, the loading process can be repeated, or other suitable corrective actions may be taken. Data reading operations may be performed periodically during normal operation to confirm that loaded configuration data remains valid.

During data read operations, data lines 108 are used as read lines. In particular, the DATA1, DATA2, and DATA3 lines 108 may be used to convey loaded configuration data values from a column of addressed memory elements 20 to registers in the data loading and reading circuitry.

Loaded configuration data is used to control the operation of the programmable logic on device 10, so that the device 10 can be used in a system. During normal operation (user mode operation), the output 114 of each memory element 20 produces a corresponding static control signal for controlling the gate of an NMOS transistor such as an NMOS pass transistor, a PMOS transistor such as a PMOS power-down transistor, or other circuit component in the programmable core logic 18 of the programmable logic device 10.

Figure 4:
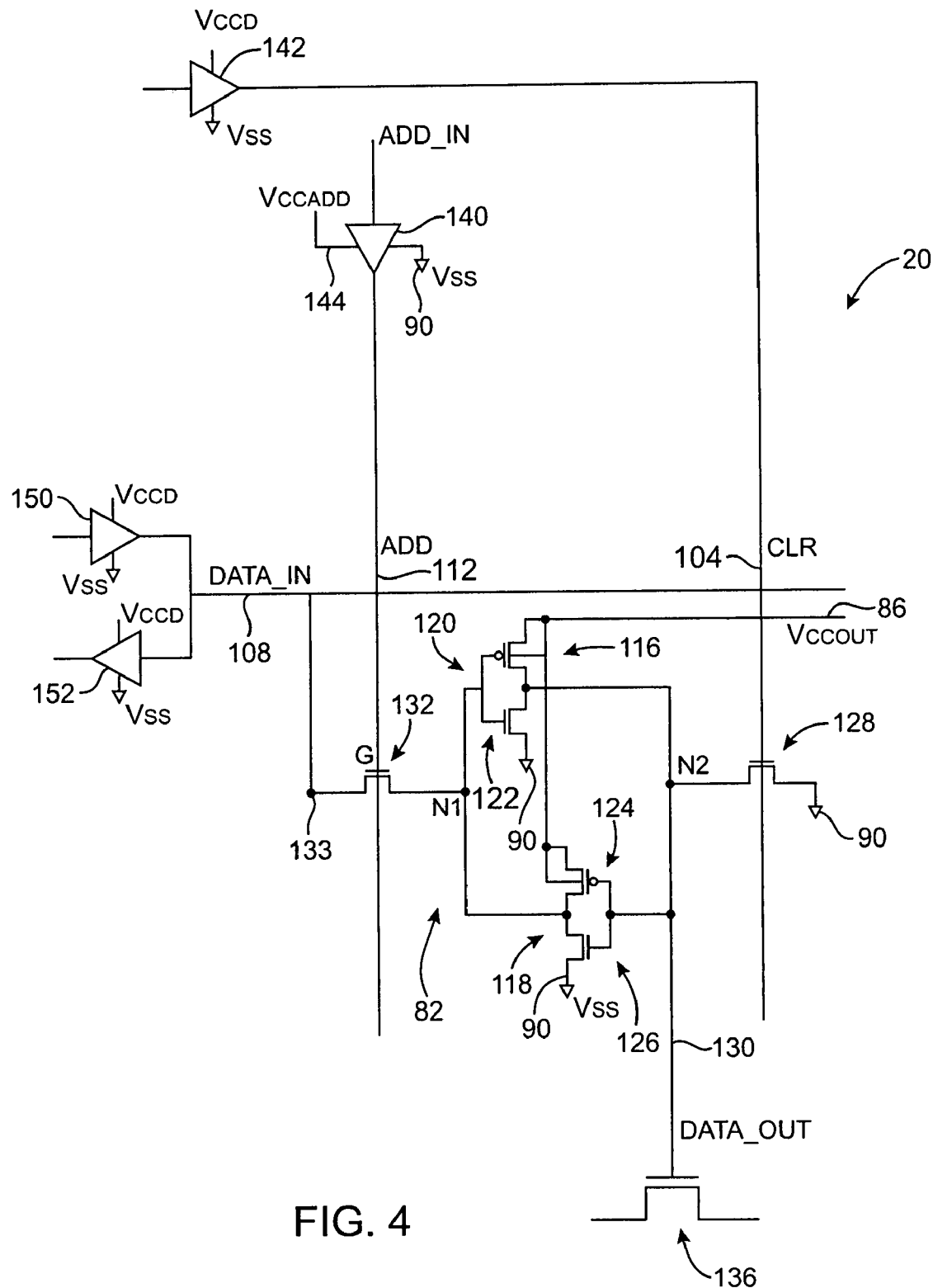
FIG. 4 is a diagram of an illustrative programmable logic device memory element that may be powered using regulator circuitry in accordance with an embodiment of the present invention.

An illustrative memory element 20 is shown in FIG. 4. Memory element 20 may be cleared by asserting the CLR signal on line 104 to turn on clear transistor 128 and thereby connect node N2 to ground terminal 90 as voltage Vccout is being ramped up.

During programming, memory element 20 receives data on DATA_IN line 108. After data has been loaded into the array, a data confirmation operation is performed to determine whether the data has been loaded properly. During data confirmation operations, the DATA_IN line serves as a verification pathway. When loading, data flows into the array 88 along lines 108. When performing data confirmation operations, data flows from the array 88 into registers in associated data loading and reading circuitry in the opposite direction along lines 108.

During both loading and reading operations, address signals ADD are systematically asserted on address lines 112. This allows the data loading and reading circuitry to address the columns of the array 88 for data writing or reading.

Storage element 82 of memory element 20 is formed from two cross-coupled inverters. Inverter 116 has transistors 120 and 122. Inverter 118 has transistors 124 and 126. Transistors 120 and 124 are p-channel metal-oxide-semiconductor transistors. Transistors 122 and 126 are n-channel metal-oxide-semiconductor transistors. The voltages on nodes N1 and N2 have opposite polarity. When N1 is low, N2 is high and the memory element 20 is said to be programmed. The content of a programmed memory element in this situation is a logic one. When N1 is high and N2 is low, the memory element contains a logic zero and is said to be cleared.

As shown in FIG. 4, the voltage on node N2 is the same as the DATA_OUT voltage. The DATA_OUT signal is applied to programmable core logic components such as transistor 136 over lines such as line 130 (shown as outputs 114 in FIG. 3).

Storage element 82 is powered using positive power supply voltage Vccout at terminal 86 and ground power supply Vss at ground terminal 90. Address drivers such as address driver 140 are powered using positive power supply voltage Vccadd at terminal 144 and ground power supply Vss at a ground terminal 90.

Figure 5:
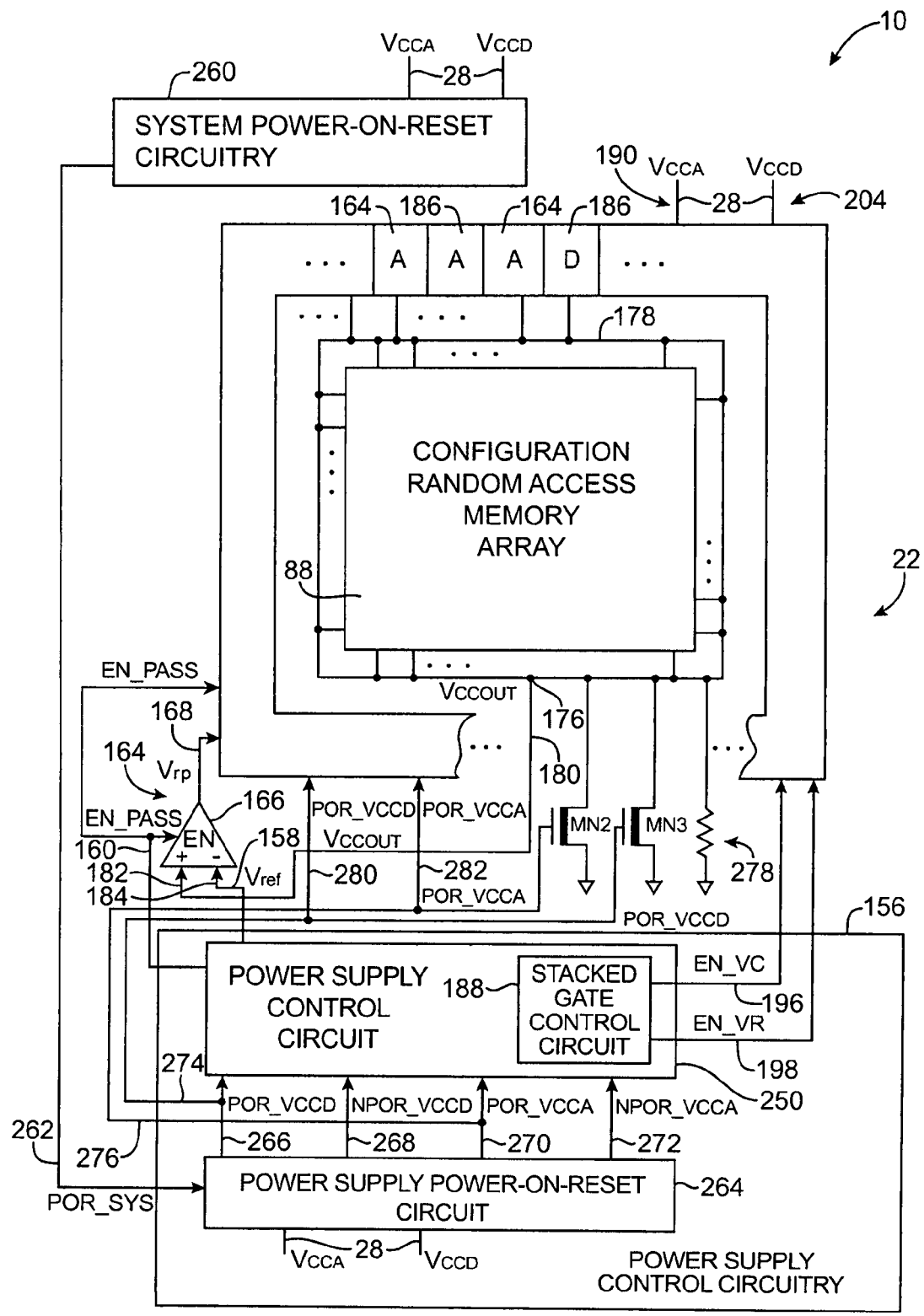
FIG. 5 is a diagram of illustrative power regulator circuitry in accordance with an embodiment of the present invention.

Illustrative power regulator circuitry 22 that may be used to generate the power supply voltages for configuration random access memory array 88 or other components on an integrated circuit such as device 10 is shown in FIG. 5. Power regulator circuitry 22 may have a regulated power supply circuit and a switch-based power supply circuit that are used in producing power supply output voltage Vccout. Power supply voltage Vccout may be used to power storage elements 82 in array 88 or may be used to power any other suitable circuitry on device 10. The regulated power supply circuit and the switch-based power supply circuit may be controlled by control circuitry 156.

The regulated power supply circuit may include a power transistor that is made up of a single power transistor device or multiple parallel power transistor devices. Arrangements that use multiple parallel power transistor devices for the power transistor may be preferred in situations in which the power transistor is used to handle relatively larger current loads. In the example of FIG. 5, the power transistor devices for the power transistor are located in a ring around array 88 (i.e., in the boxes labeled "A").

The power transistor in the regulated power supply may be, for example, a metal-oxide-semiconductor transistor having two source-drain terminals and a gate terminal. A gate control signal Vrp may be applied to the gate of the power transistor. In scenarios in which the power transistor is made up of multiple parallel transistors, the gate control signal Vrp is applied in parallel to the gates of all of the parallel transistors. The gate control signal Vrp may be generated by operational amplifier 166. The circuitry that makes up regulated power supply circuit of circuitry 22 is shown as regulated power supply circuit 164 in FIG. 5. Regulated power supply circuit 164 may be controlled using control signals such as EN_PASS.

The switch-based power supply circuit may contain a digital switch. The digital switch may contain a pair of series-connected p-channel metal-oxide-semiconductor transistors (as an example). If desired, the digital switch may be implemented by combining multiple sets of series-connected p-channel metal-oxide-semiconductor transistors in parallel. In this type of arrangement, the pair of transistors in the digital switch may be made up of a number of parallel transistor pairs. For example, each of the boxes labeled "D" in the example of FIG. 5 may include one of these transistor pairs. The circuitry that makes up the switch-based power supply circuit of circuitry 22 is shown as switch based power supply circuit 186 (circuit blocks "D") in FIG. 5.

Depending on its mode of operation, power regulator circuitry 22 may use regulated power supply circuit 164 or switch-based power supply circuit 186 to supply power supply output voltage Vccout on output path 178. When regulated power supply circuit 164 is in operation, the power transistor in the regulated power supply circuit produces a regulated output power Vccout on output 178. When switch-based power supply circuit 186 is in operation, its digital switch is on and the power supply voltage Vccd on terminal 204 is conveyed to output line 178 through the digital switch. The digital switch in switch-based power supply circuit 186 may be formed by one or more parallel sets of serially stacked transistors.

The operation of power regulator circuitry 22 may be controlled by control circuitry 156. Control circuitry 156 may generate a reference voltage Vref on output line 158. The magnitude of Vref may control the magnitude of Vccout when power regulator circuitry 22 is operated in its regulated output mode. The signal Vref may be conveyed to regulated power supply circuit 164 via path 158. Control circuitry 156 may also generate an enable (disable) control signal EN_PASS on path 160 and enable (disable) control signals EN_VC and EN_VR on respective paths 196 and 198.

When EN_PASS is asserted (e.g., taken high to Vcca), regulated power supply circuit 164 is turned on. When EN_PASS is deasserted (e.g., taken low to Vss), regulated power supply circuit 164 is turned off.

The signal EN_VC may turn on and off a first p-channel metal-oxide-semiconductor transistor in the digital switch of circuit 186, whereas the signal EN_VR may turn on and off a second p-channel metal-oxide-semiconductor transistor in the digital switch of circuit 186. The first and second p-channel metal-oxide-semiconductor transistors, which may sometimes be referred to as transistors MPD1 and MPD2, may be turned on and off in any suitable order (e.g., to help avoid latch-up conditions) during transitions between operating modes in which power regulator circuitry 22 is used to produce different voltage levels. To turn off switch-based power supply circuit 186, signals EN_VC and EN_VR are deasserted (e.g., taken to a value that places a high voltage on the gates of digital switch transistors MPD1 and MPD1 to turn off digital switch transistors MPD1 and MPD2). The digital switch in switch-based power supply circuit 186 may be turned on by asserting signals EN_VC and EN_VR (e.g., taking EN_VC and EN_VR to a value that makes the gates of p-channel transistors MPD1 and MPD2 go low, thereby turning on p-channel transistors MPD1 and MPD2).

Control circuitry 156 may control the states of circuits 164 and 186 depending on the mode of operation that is desired for power regulator circuit 22 (e.g., to support data loading or user mode operations for device 10).

Regulated power supply circuit 164 has an operational amplifier 166. The enable input EN of operational amplifier 166 is used to enable or disable operational amplifier 166 based on the state of signal EN_PASS on path 160. The output of operational amplifier 166 produces the signal Vrp on path 168. The signal Vrp is applied to the gate of a power transistor (e.g., p-channel metal-oxide-semiconductor transistors in blocks "A" of FIG. 5). The body terminal of the power transistor may be connected to Vcca terminal 190.

When EN_PASS is low, operational amplifier 166 is disabled and the signal Vrp is forced high to Vcca. With Vrp at Vcca, the gate of the p-channel power transistor in regulated power supply circuitry 164 is high and the p-channel power transistor is off.

When EN_PASS is high, operational amplifier 166 is enabled and the components of circuit 164 form a low-dropout regulator. Feedback path 180 feeds the voltage on node 176 (i.e., the output voltage Vccout) to the positive input 182 of operational amplifier 166. Operational amplifier 166 receives reference voltage Vref at negative input 184. Operational amplifier 166 compares the voltages on inputs 182 and 184 and produces a corresponding output signal Vrp on path 168. If the voltage Vccout falls below Vref, the signal Vrp falls, turning on the power transistor that is controlled by signal Vrp more strongly and thereby increasing Vccout towards Vref. If the voltage Vccout rises above Vref, the signal Vrp rises, weakening the amount that the power transistor in circuit 164 is turned on and thereby decreasing Vccout.

Power supply control circuitry 156 may include control circuitry such as power supply control circuit 250. Control circuit 250 may include a circuit such as stacked gate control circuit 188. Control circuit 188 may receive power supply voltage Vcca and power supply voltage Vccd. During operation, stacked gate control circuit 188 may produce gate control signals EN_VC on path 196 and EN_VR on path 198.

Figure 6:
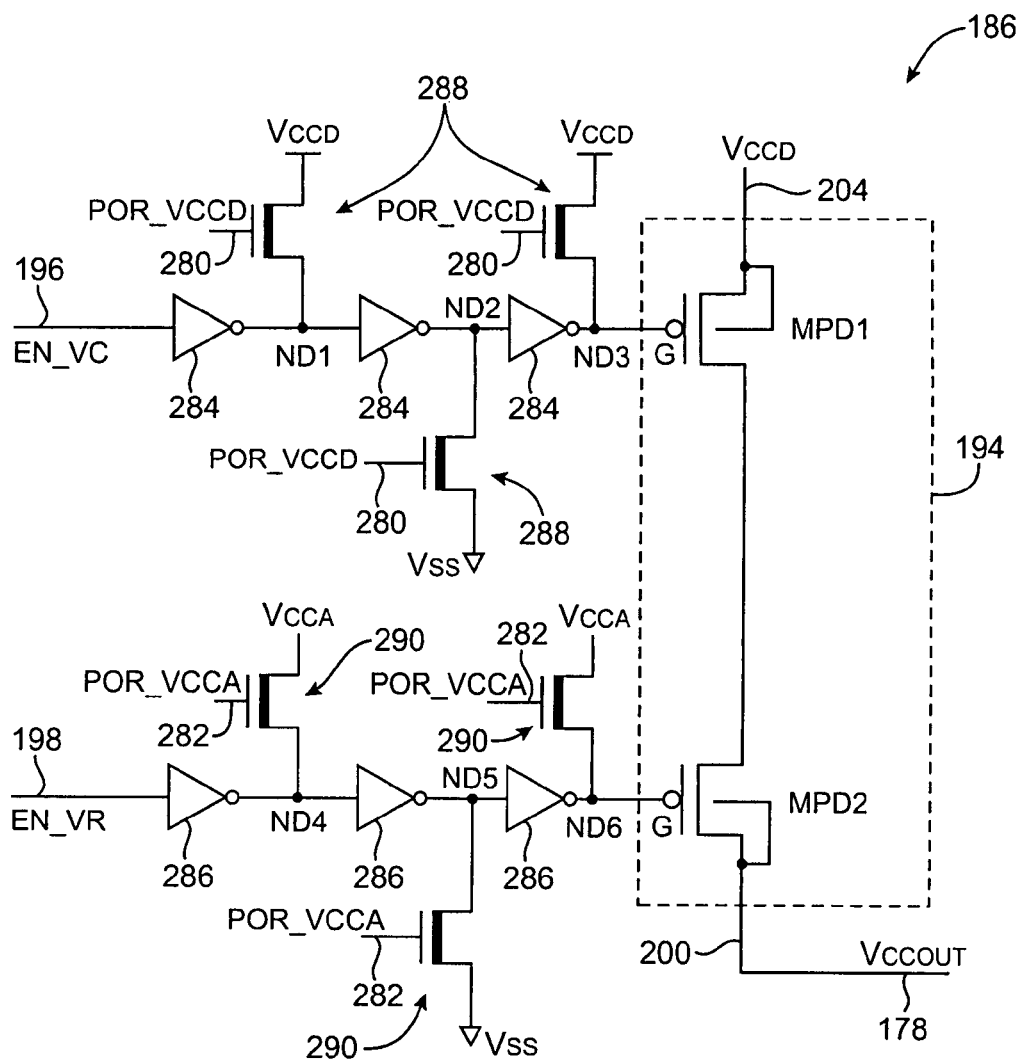
FIG. 6 is a diagram of an illustrative switch-based power supply circuit that may be used in power regulator circuitry in accordance with an embodiment of the present invention.

An illustrative switch-based power supply circuit 186 is shown in FIG. 6. As shown in FIG. 6, digital switch 194 of circuit 186 has transistors MPD1 and MPD2. Digital switch 194 is controlled by control signals EN_VC and EN_VR. The signal EN_VC (or its complement) may be applied to the gate of p-channel metal-oxide-semiconductor transistor MPD1 via path 196. When EN_VC is low (as an example), the gate of transistor MPD1 is high and transistor MPD1 is off. Transistor MPD1 is on when EN_VC is high and the gate of transistor MPD1 is low (as an example). The polarities of digital signals such as EN_VC and EN_VR can be reversed using inverters if desired.

The signal EN_VR is used to control the gate of p-channel metal-oxide-semiconductor transistor MPD2 via path 198. The signal EN_VR may be used to turn on or off transistor MPD2, by taking the gate of transistor MPD2 low or high. The body terminal of transistor MPD1 may be connected to power terminal 204. The body terminal of transistor MPD2 may be connected to path 200.

Control circuit 188 of FIG. 5 may control the sequence in which signals EN_VC and EN_VR are generated during mode transitions to help prevent latchup conditions in the p-channel metal oxide transistors of digital switch 194.

As shown in FIG. 5, device 10 may have system power-on-reset circuitry 260. System power-on-reset circuitry 260 may monitor the power supply voltages Vcca and Vccd on terminals 28 and may generate a corresponding system power-on-reset signal POR_SYS on path 262. During power-up operations, the signal POR_SYS rises with the rising input voltages Vcca and Vccd. When both Vcca and Vccd have reached sufficiently high levels to properly power device 10, system power-on-reset circuitry 260 takes POR_SYS to a low value (i.e., Vss). Circuitry on device 10 (e.g., programmable logic or other core circuitry) may be disabled until POR_SYS goes low to prevent potential damage or unstable operation.

The POR_SYS signal may also be applied to power supply power-on-reset circuit 264. Power supply power-on-reset circuit 264 may generate corresponding power supply power-on-reset control signals such as POR_VCCD, NPOR_VCCD, POR_VCCA, and NPOR_VCCA. Signal POR_VCCD may be applied to power supply control circuit 250 on path 266. Path 268 may be used to convey signal NPOR_VCCD to power supply control circuit 250. Paths 270 and 272 may be used to convey signals POR_VCCA and NPOR_VCCA to power supply control circuit 250. Paths 280 and 282 may be used to route the signals POR_VCCD and POR_VCCA to regulated power supply circuit 164 and switch-based power supply circuit 186. Power-on-reset signal POR_VCCD may also be applied to the gate of transistor MN3 via path 274. Power-on-reset signal POR_VCCA may be applied to the gate of transistor MN2 via path 276. The power-on-reset signals and associated components of power regulator circuitry 22 are used to help ensure that the circuitry of power regulator circuitry 22 does not experience undesirable power surges or latch-up conditions during power up.

As indicated by their darkened gate symbols, transistors MN2 and MN3 are preferably depletion mode n-channel metal-oxide-semiconductor (depletion NMOS) transistors. Depletion mode transistors (which are also sometimes referred to as "native" transistors) have a negative threshold voltage (i.e., Vt<0 volts). As a result, these transistors will be turned on, even when the voltage on their gate terminals is at 0 volts (e.g., Vss).

During power up, the order in which power supply signals such as Vcca and Vccd are powered is not necessarily known in advance. Transistor MN2 helps to ensure that node 176 will be pulled to a low value (Vss) in the event that power supply voltage Vcca rises first. In the event that power supply voltage Vccd rises first, transistor MN3 will turn on and pull node 176 to Vss. Resistor 278 may be used to provide a leakage current path for discharging node 176 in the event that the memory elements of configuration random access memory array 88 do not provide a sufficiently large leakage current path (i.e., at low temperatures in which storage element leakage currents are minimized). Resistor 278 may be, for example, a polysilicon resistor. In the absence of leakage currents, the voltage Vccout on node 176 may drift high, so use of transistors such as transistors MN2 and MN3 and resistors such as resistor 278 helps to ensure that the voltage Vccout remains at its desired value by helping to avoid residual nonzero voltages Vccout on node 176 during power-up operations. Ensuring that Vccout is held low during power-up helps to ensure that the states of the storage elements in memory array 88 are well controlled.

Figure 7:
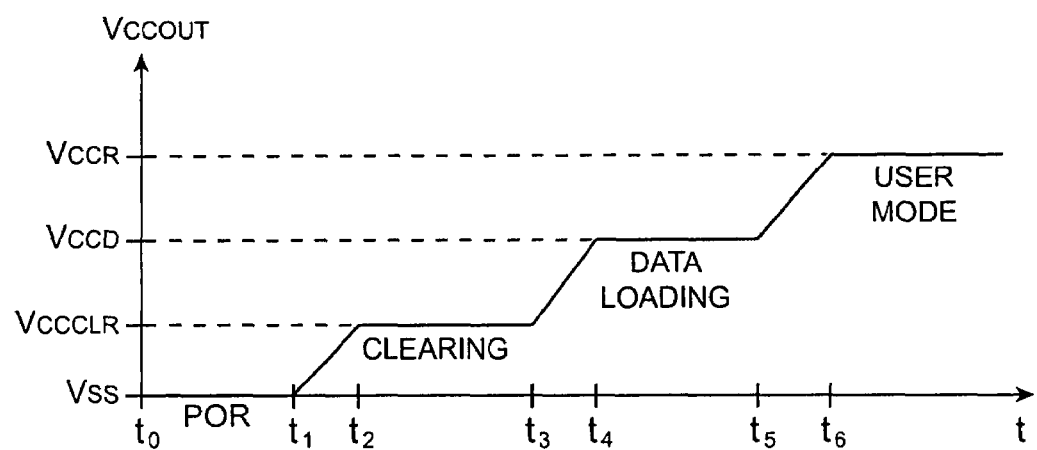
FIG. 7 is a graph showing illustrative output voltage levels that illustrative power regulator circuitry may produce during different modes of operation in accordance with an embodiment of the present invention.

A graph showing how the value of Vccout on line 178 may be varied during use of device 10 is shown in FIG. 7. Initially, at time t0, device 10 is powered up. During power-up operations (e.g., from time t0 to time t1 in the graph of FIG. 7), power supply voltages such as Vcca and Vccd are applied to device 10. The order in which power supply voltages Vcca and Vccd are applied to device 10 and the rate at which these voltages rise to acceptable voltage levels is not necessarily known in advance. Unless care is taken to prevent inadvertent circuit operations, the transistors in the power regulator circuitry might assume unexpected states and might, as a result, produce unexpected values of Vccout. In turn, these unexpected values of Vccout might place the storage elements in array 88 in an unexpected state.

To avoid these potential problems, device 10 may be provided with power supply power-on-reset circuitry 264 of the type shown in FIG. 5. During power-up operations (e.g., between time t0 and t1 in the graph of FIG. 7), power-on-reset circuitry 264 may generate power supply power-on-reset signals that ensure that the transistors and other components in power regulator circuitry 22 are maintained at appropriate values.

Following power up, power regulator circuitry 22 turns on regulated power supply circuit 164 and uses regulated power supply circuit 164 to produce a controlled value of Vccout (times t1 to t4). Output voltage Vccout is initially ramped up from 0 volts (times t1 to t2), as shown in the graph of FIG. 7. At times t2 to t3, power regulator circuit 22 holds the value of Vccout at a relatively low value Vccclr (e.g., 0.3 volts) while programmable memory elements 20 in array 88 are cleared.

After clearing operations have been completed, power regulator circuitry 22 ramps up the voltage Vccout from Vccclr to Vccd (times t3 to t4). Between times t4 and t5, control circuitry 156 turns off regulated power supply circuit 164 and turns on switch-based power supply circuit 186. This turns on the digital switch in switch-based power supply circuit 186 and electrically connects the output line 178 to Vccd terminal 204. Accordingly, from times t4 to t5, the output voltage Vccout of voltage regulator 22 is held at Vccd, as shown in FIG. 7.

At time t5, control circuitry 156 turns on regulated power supply circuit 164 and turns off switch-based power supply circuit 186 by asserting the signal EN_PASS and deasserting signals EN_VC and EN_VR. This turns off the digital switch in circuit 186 and turns on operational amplifier 166 and the other circuitry of regulated power supply circuit 164. In this mode of operation, the magnitude of output voltage Vccout is controlled by the magnitude of the reference voltage signal Vref that is supplied to regulated power supply circuit 164 via path 158. From time t5 to t6, the voltage Vccout is ramped up to elevated memory element power supply voltage Vccr (e.g., 1.55 volts). At times after t6, device 10 is in normal operation (user mode).

At time t5, there is a transition in which control circuitry 156 switches the power regulator circuitry 22 from a switch-based power supply mode of operation to a regulated power supply mode of operation. During this transition, control circuitry 156 preferably asserts the signal EN_PASS before deasserting the signals EN_VC and EN_VR. The analog circuitry of regulated power supply circuit 164 is generally slower to respond to control signals than the digital circuitry of switch-based power supply circuit 186, so this approach creates an intentional overlap in the power supply control signals that ensures that the analog circuitry of power supply circuit 164 is fully on and has reached steady state operation before the digital switch 194 is turned off. This allows droop in Vccout to be minimized.

An illustrative switch-based power supply circuit 186 is shown in FIG. 6. As shown in FIG. 6, switch-based power supply circuit 186 may have a digital switch 194 that is formed of a pair of series-connected transistors MPD1 and MPD2. In practice, a single set of transistor devices may be insufficient for carrying required current loads. In situations such as these, transistors MPD1 and MPD2 may be implemented using multiple transistor devices connected in parallel.

Signal EN_VC may be routed to circuit 186 from power supply control circuit 250 in control circuitry 156 (FIG. 5). One or more buffers such as inverters 284 may be used to strengthen the control signal from transistor MPD1. Buffers 284 may form part of a global signal distribution path for signal EN_VC.

Similarly, signal EN_VR may be routed to circuit 186 from power supply control circuit 250. Buffers such as inverters 286 may be used to strengthen signal EN_VR as signal EN_VR is distributed across device 10.

Depletion mode transistors 288 and 290 may serve as active leakers that ensure that the control signal distribution path nodes such as nodes ND1, ND2, ND3, ND4, ND5, and ND6 have suitable voltages during power-up operations. Power supply power-on-reset circuit 264 of FIG. 5 generates power-on-reset control signals POR_VCCD and POR_VCCA based on the value of the system power-on-reset signal POR_SYS and the voltages Vcca and Vccd on terminals 28. When Vccd reaches an acceptable voltage level for normal operation, POR_VCCD goes low and NPOR_VCCD goes high. Similarly, when Vcca reaches an acceptable voltage level for normal operation, POR_VCCA goes low and NPOR_VCCA goes high.

The active leakers formed by transistors 288 ensure that nodes ND1, ND2, and ND3 have suitable voltages during power-up. The transistors 288 that are connected to nodes ND1 and ND3 are connected to power supply voltage terminals at voltage Vccd, whereas the transistor 288 that is connected to node ND2 is connected to a power supply voltage terminal at Vss. During power-up, when Vccd is ramping up to its normal operating value, signals POR_VCCD begin to rise. Transistors 288 are depletion mode transistors, so transistors 288 turn on, even if POR_VCCD is at 0 volts (Vss). This shorts nodes ND1 and ND3 to the Vccd terminals in circuit 186 and shorts node ND2 of circuit 186 to the Vss terminal. With nodes ND1 and ND3 pulled high in this way and with node ND2 pulled low, the voltage at node ND3 is held high and transistor MPD1 is turned off. The state of transistor MPD1 is therefore defined during power up.

The use of multiple transistors 288 can be advantageous, because this allows each transistor 288 which is powered by Vccd to be sufficiently strong to overcome the NMOS transistor in a preceding inverter 284. If desired, a different number of power-on-reset transistors 288 may be used, provided that they are sufficiently strong to pull their associated nodes to desired power supply voltage levels during power-up operations. When buffers 284 are formed from inverters, half of the transistors 288 in the path between input 196 and gate G of transistor MPD1 are connected to Vccd. Every other transistor in the path (i.e., the transistor connected to node N2 in the example of FIG. 6) is connected to Vss.

Depletion mode transistors 290 operate similarly. The active leakers formed by transistors 290 ensure that nodes ND4, ND5, and ND6 have suitable voltages during power-up so that the state of transistor MPD2 is defined. The transistors 290 that are connected to nodes ND4 and ND6 are connected to power supply voltage terminals at voltage Vcca, whereas the transistor 290 that is connected to node ND5 is connected to a power supply voltage terminal at Vss. During power-up, when Vcca is ramping up to its normal operating value, signals POR_VCCA begin to rise. Transistors 290 turn on even if POR_VCCA is at 0 volts, because transistors 290 are preferably depletion mode transistors. Turning transistors 290 on shorts nodes ND4 and ND6 to the Vcca terminals in circuit 186 and shorts node ND5 to the Vss terminal. With nodes ND4 and ND6 pulled high and with node ND5 pulled low, the voltage at node ND6 (gate G of transistor MPD2) is held high and transistor MPD2 is turned off. It is generally desirable to use multiple power-on-reset transistors 290, as shown in the example of FIG. 6, because this ensures that each transistor 290 which is powered by Vcca will be sufficiently strong to overcome the NMOS transistor in a preceding inverter 286.

Figure 8:
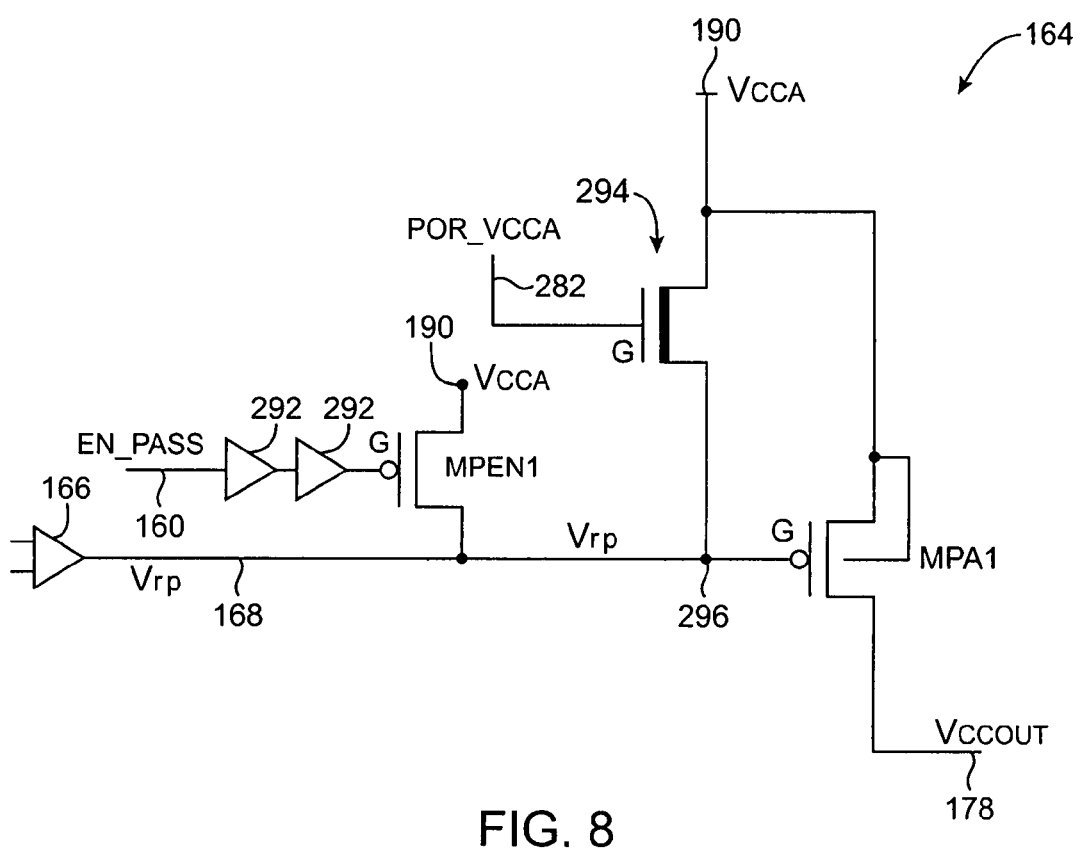
FIG. 8 is a diagram of an illustrative regulated power supply circuit that may be used in power regulator circuitry in accordance with an embodiment of the present invention.

There is typically a single operational amplifier 166 associated with the regulated power supply circuit 164. The output of the operational amplifier 166 may be distributed to circuit blocks "A" (FIG. 5) using path 168. The circuitry of the regulated power supply circuit 164 that is downstream from operational amplifier 166 is shown in FIG. 8. As shown in FIG. 8, regulated power supply circuit 164 receives a control signal Vrp from operational amplifier 166 on path 168. Power transistor MPA1 may be formed from a signal transistor device or multiple transistor devices connected in parallel (e.g., in a ring around array 88 as shown in FIG. 5). Path 168 distributes the control signal Vrp to the gate G of power transistor MPA1.

During operation of device 10, power supply control circuit 250 generates the control signal EN_PASS on path 160. Buffers such as buffers 292 may be used to strengthen the control signal EN_PASS as this signal is distributed to the gate G of transistor MPEN1 of FIG. 8. Transistor MPEN1 disables circuit 164 when EN_PASS is low by pulling node 296 to Vcca and thereby taking gate G of transistor MPA1 high to turn off transistor MPA1. Power-on-reset transistor 294 may be formed from a depletion mode device. Gate G of transistor 294 may receive power-on-reset control signal POR_VCCA from power supply power-on-reset circuit 264. During power-up, signal POR_VCCA follows power supply voltage Vcca, so transistor 294 is turned on and serves as an active leaker that pulls signal Vrp on node 296 to Vcca at terminal 190 and holds transistor MPA1 off.

Figure 9:
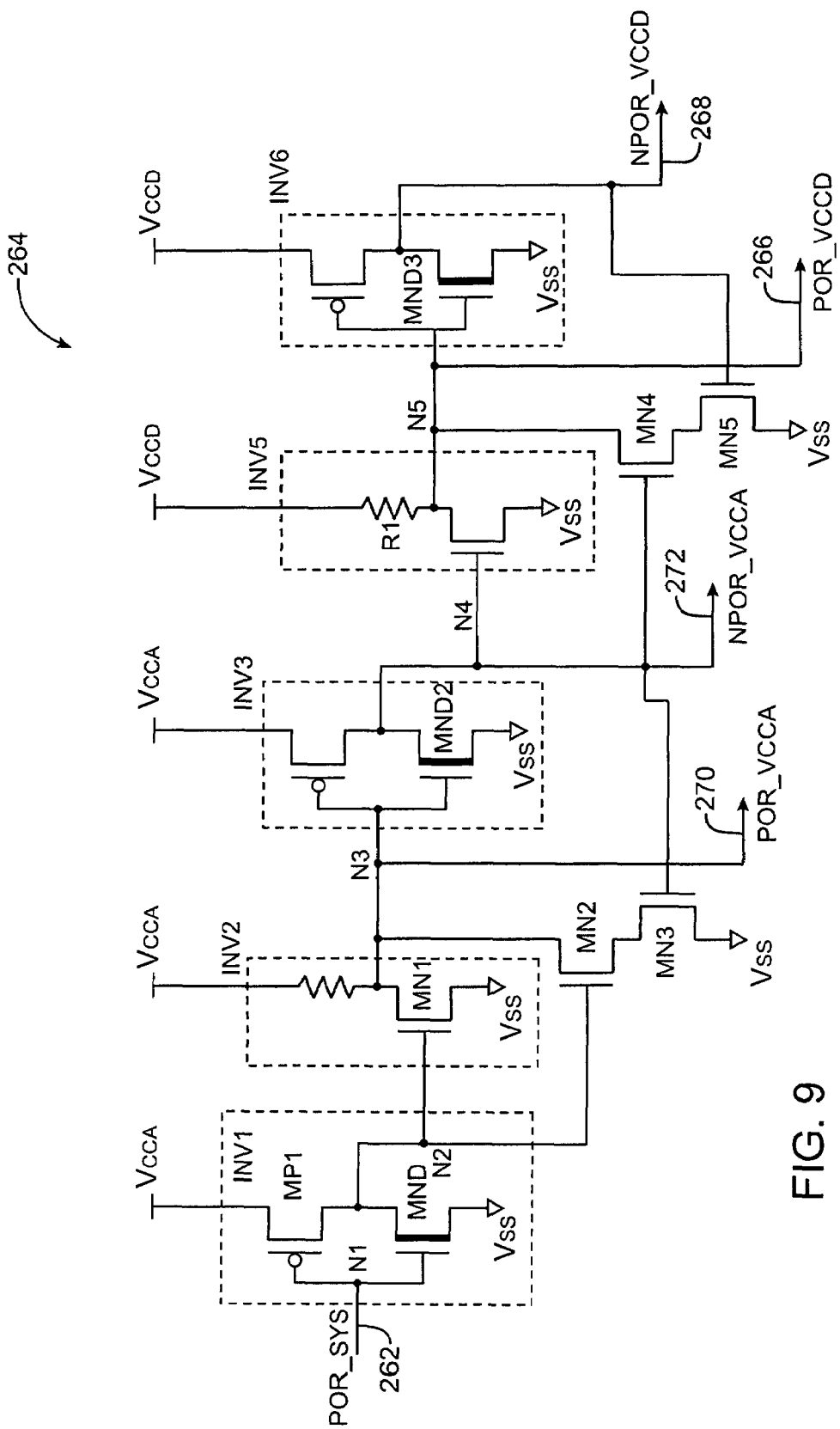
FIG. 9 is a diagram of an illustrative power supply power-on-reset circuit that may be used in power regulator circuitry in accordance with an embodiment of the present invention.

Because the active leakers of FIGS. 6 and 8 are formed with depletion mode n-channel metal-oxide-semiconductor transistors, they turn on as soon as their power-on-reset control signals start to go high. The power-on-reset control signals may be produced by power supply power-on-reset circuit 264 (FIG. 5). An illustrative power supply power-on-reset circuit 264 is shown in FIG. 9. As shown in FIG. 9, the power-on-reset control signals POR_VCCA, NPOR_VCCA, POR_VCCD, and NPOR_VCCD may be produced on terminals 270, 272, 266, and 268 by power supply power-on-reset circuit 264 based on power supply voltages Vcca and Vccd and the system power-on-reset control signal POR_SYS that is received via path 262.

Figure 10:
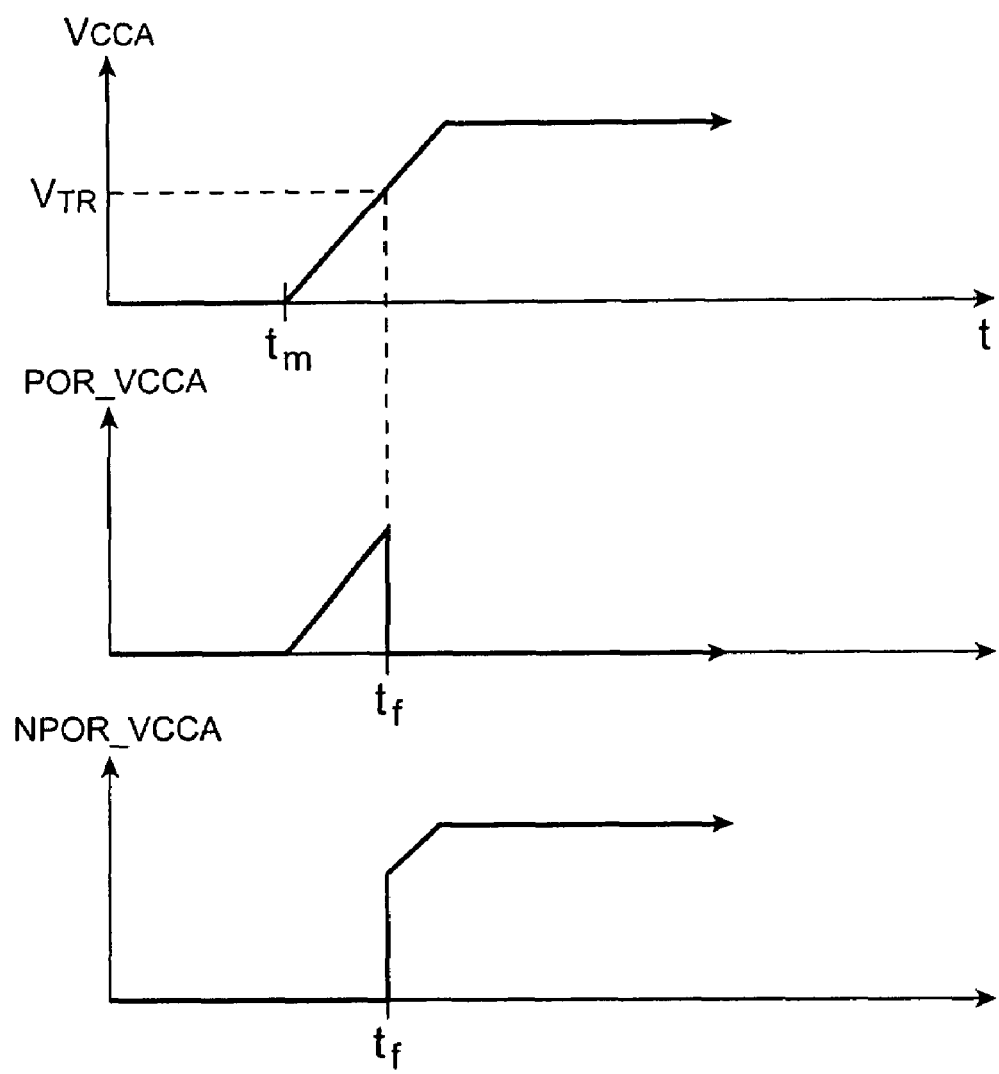
FIGS. 10 and 11 are graphs showing illustrative power-on-reset signals that may be associated with the power supply voltage for a regulated power supply circuit in accordance with an embodiment of the present invention.

The graph of FIG. 10 shows three signal traces in an illustrative scenario for circuit 264 in which power supply voltage Vcca begins ramping up at time $t_m$ and reaches its desired minimum operating voltage, $V_{tr}$, at time $t_f$. As shown in FIG. 10, at time $t_f$, circuit 264 takes POR_VCCA low, signaling that power supply voltage Vcca has reached an acceptable level to support normal operation in device 10. Signal NPOR_VCCA is the inverse of signal POR_VCCA, so NPOR_VCCA is high at times after $t_f$. Circuit 264 produces signals POR_VCCD and NPOR_VCCD in the same way in response to measured values of power supply voltage Vccd.

System power-on-reset circuitry 260 may contain a transistor in its output stage that has a positive threshold voltage Vt. As a result of this non-zero threshold voltage, the output signal POR_SYS that is produced by system power-on-reset circuitry 260 is undefined for voltages less than Vt. If care is not taken in the design of circuitry such as the circuit 264 of FIG. 9, this undefined regime for signal POR_SYS could lead to glitches in the power-on-reset signal POR_VCCA and other signals.

Figure 11:
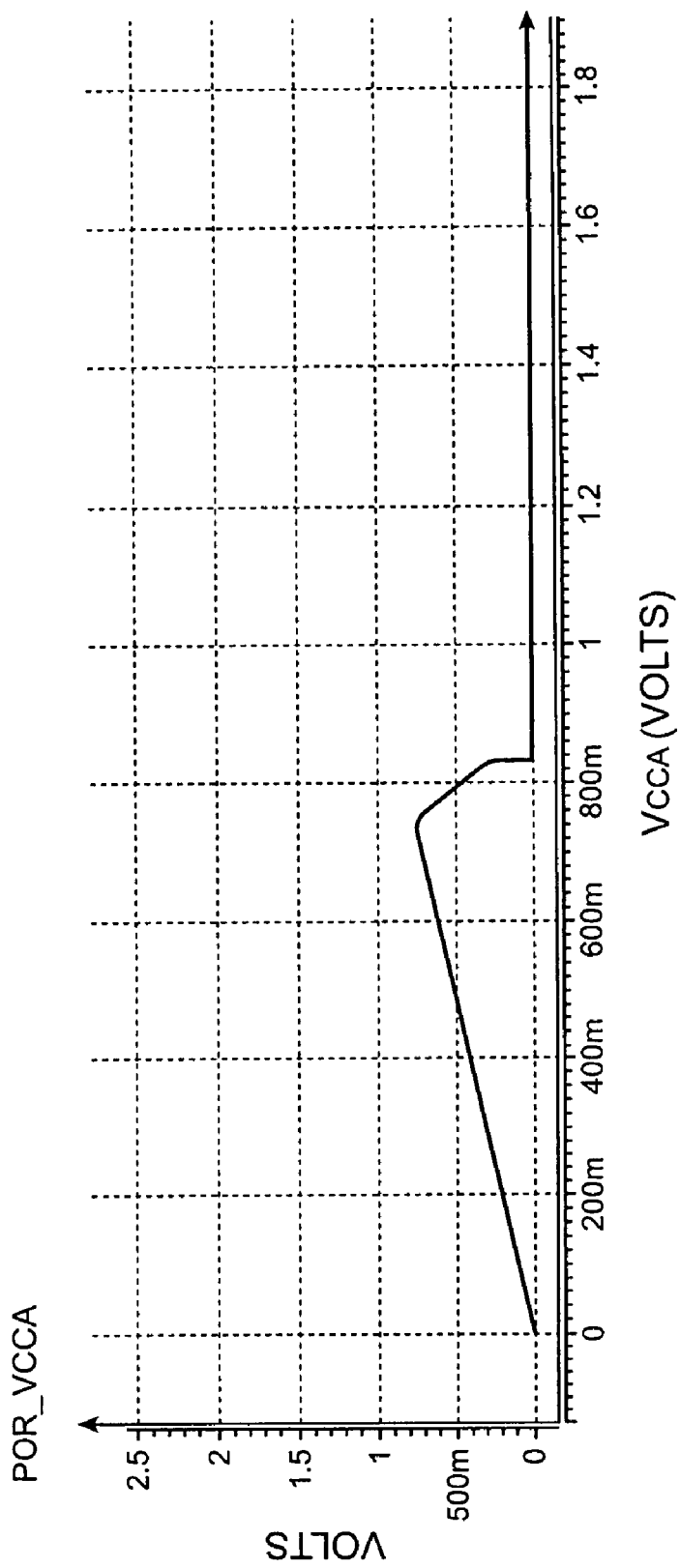

Circuit 264 of FIG. 9 uses an arrangement that is relatively immune to glitches of this type. As shown in FIG. 9, circuit 264 may contain inverters INV1, INV2, INV3, INV5, and INV6. In inverter INV1, transistor MND may be relatively strong. Transistors MP1 and MN1 may be relatively weak. Simulations have been performed for output signal POR_VCCA under the worst case scenario (POR_SYS equal to 0 volts). The results of this type of simulation are shown in FIG. 11. In FIG. 11, the value of the power-on-reset control signal POR_VCCA that is produced by circuit 264 is plotted as a function of the power supply voltage Vcca that is received at the Vcca power supply terminal of circuit 264.

As shown in the graph of FIG. 11, the signal POR_VCCA tracks voltage Vcca linearly up to a Vcca value of about 0.7 volts, regardless of the value of POR_SYS (which is assumed to be at the worst-case value of 0 volts). By the time Vcca has reached 0.7 volts, POR_SYS is defined (i.e., POR_SYS exceeds the threshold voltage Vt in the output stage of power-on-reset circuitry 260) and is ramping to a high voltage. With signal POR_SYS high, node N1 in circuit 264 will be high and node N2 in circuit 264 will be low. The voltage on node N3, which is equal to the signal POR_VCCA, will be high and will therefore linearly track voltage Vcca on the positive power supply terminal of inverter INV2 as desired.

It is also desirable for circuit 264 to exhibit a linear ramp for signal POR_VCCD. Signal POR_VCCA on node N3 tracks voltage Vcca. Inverter INV3 has a depletion mode n-channel metal-oxide-semiconductor transistor MND2, so the output of inverter INV3 (power-on-reset control signal NPOR_VCCA) will be held at Vss during power-up, while voltage Vcca is ramping up. The voltage at node N4 (power-on-reset control signal NPOR_VCCD) is therefore well defined (at Vss).

With the voltage at node N4 at Vss, the output voltage N5 of inverter INV5 will track power supply voltage Vccd. There is no threshold voltage disruption of output node N5 because a polysilicon resistor such as polysilicon resistor R1 is used as the pull up stage of inverter INV5. Inverter INV6 has a depletion mode n-channel metal-oxide-semiconductor transistor MND3. Because MND3 is a depletion mode device, even 0 volts of POR_VCC will turn on transistor MND3. The power-on-reset control signal NPOR_VCCD will therefore be held at ground voltage Vss during power-up.

After the power-up process is complete, the system power-on-reset signal POR_SYS will go low. The circuitry 264 of FIG. 9 will take power-on-reset control signal POR_VCCA and power-on-reset control signal POR_VCCD low. To ensure that node N3 is fully at ground, the high signal from node N4 may be fed back to the gate of transistor MN3 to turn on transistor MN3, as shown in FIG. 9. Transistors MN3 and MN4 are much stronger transistors than MN2. With system power-on-reset signal POR_SYS low, node N2 is high, so transistor MN2 is also on, pulling node N3 low. Similarly, stronger transistors MN4 and MN5 may be used to ensure that node N5 is pulled fully to ground.

Figure 12:
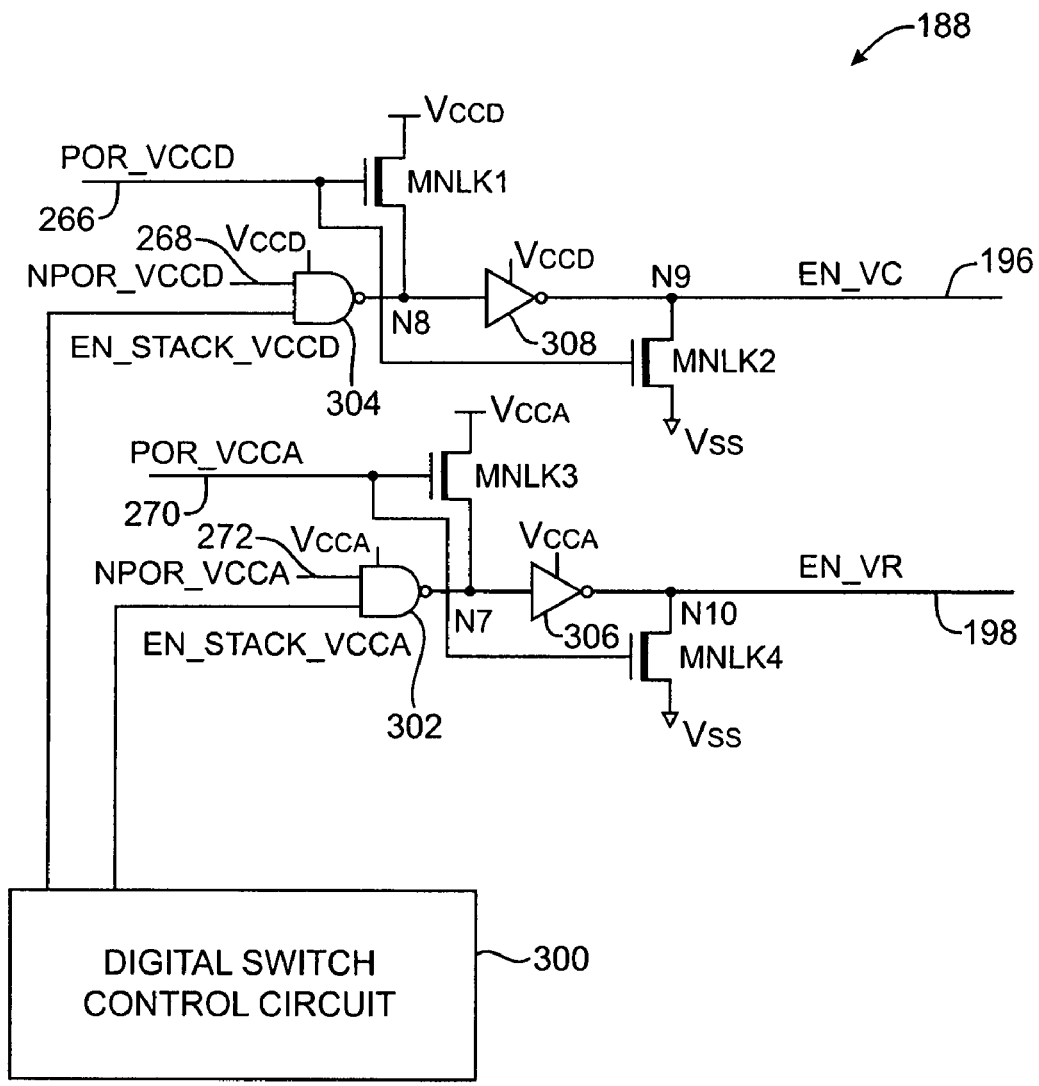
FIG. 12 is a diagram of a portion of an illustrative power supply control circuit in accordance with an embodiment of the present invention.

Illustrative circuitry for stacked gate control circuit 188 of power supply control circuit 250 is shown in FIG. 12. As shown in FIG. 12, control circuit 188 contains a digital switch control circuit 300 that may be used to generate control signals EN_STACK_VCCD and EN_STACK_VCCA for controlling the transistors MPD1 and MPD2 in the digital switch 194 (FIG. 6). During power-up operations, the states of these control signals are undefined. If care is not taken using circuitry 188, the undefined states of the control signals could cause the state of digital switch 194 to become undefined. Accordingly, circuit 188 of FIG. 12 may be used to ensure that control signals EN_VC and EN_VR on lines 196 and 198 are held low during power-up.

During power-up, NAND gate 302 receives a low NPOR_VCCA signal, so node N7 is held high. Inverter 306 inverts the high signal on node N7, ensuring that signal EN_VR on line 198 is held low. Similarly, a low NPOR_VCCD signal is supplied to input 268 of NAND gate 304, taking node N8 high. Inverter 308 inverts the high signal on node N8, so that signal EN_VC is held low.

To ensure that the circuit nodes N7, N8, N9, and N10 are held at known voltages during power-up, power-on-reset transistors MNLK1, MNLK2, MNLK3, and MNLK4 serve as active leakers. Transistors MNLK1 and MNLK3 connect nodes N8 and N7 to power supply terminals Vccd and Vcca to pull nodes N8 and N7 high during power up. Transistors MNLK2 and MNLK4 hold nodes N9 and N10 at Vss during power up. The active leakers formed by transistors MNLK1, MNLK2, MNLK3, and MNLK4 and the use of gating logic such as NAND gates 302 and 304 ensure that the values of EN_VC and EN_VR and therefore the states of the transistors in digital switch 194 are defined during power up.

The foregoing is merely illustrative of the principles of this invention and various modifications can be made by those skilled in the art without departing from the scope and spirit of the invention.

What is claimed is:

1. Power regulator circuitry on an integrated circuit, comprising:
   at least one power supply terminal that receives a power supply voltage;
   an output at which a regulated output voltage is provided;
   at least one node;
   at least one depletion mode transistor that is connected between the node and the power supply terminal and that has a gate; and
   a power supply power-on-reset circuit that applies power-on-reset control signals to the gate of the depletion mode transistor.

2. The power regulator circuitry defined in claim 1 further comprising a regulated power supply circuit that contains the node.

3. The power regulator circuitry defined in claim 1 further comprising a switch-based power supply circuit that contains the node.

4. The power regulator circuitry defined in claim 1 further comprising a plurality of power supply terminals, a plurality of nodes, and a plurality of depletion mode transistors each of which connects a respective one of the plurality of nodes to a respective one of the plurality of power supply terminals, wherein the depletion mode transistors each have a gate and wherein the power supply power-on-reset circuit applies power-on-reset control signals to each gate.

5. The power regulator circuitry defined in claim 1 further comprising:
   a switch-based power supply circuit that has a pair of metal-oxide-semiconductor transistors connected between the power supply terminal and the output terminal; and
   a plurality of inverters connected in series between an input and a gate of one of the pair of metal-oxide-semiconductor transistors, each inverter having an associated output;
   a plurality of power supply terminals;
   a plurality of nodes, each associated with a respective one of the inverter outputs; and
   a plurality of depletion mode transistors each of which connects a respective one of the plurality of nodes to a respective one of the plurality of power supply terminals, wherein the depletion mode transistors each have a gate and wherein the power supply power-on-reset circuit applies power-on-reset control signals to each gate.

6. The power regulator circuitry defined in claim 1 further comprising:
   a regulated power supply circuit that has an associated operational amplifier and a power transistor controlled by the operational amplifier, wherein the power transistor has a gate, wherein the node is connected to the gate, wherein the depletion mode transistor is connected to the node, and wherein the power-on-reset signal turns the depletion mode transistor on during power-up operations.

7. The power regulator circuitry defined in claim 1 further comprising:

a switch-based power supply circuit that has a pair of metal-oxide-semiconductor transistors connected between the power supply terminal and the output terminal;

a plurality of inverters connected in series between an input and a gate of one of the pair of metal-oxide-semiconductor transistors, each inverter having an associated output;

a plurality of power supply terminals;

a regulated power supply circuit that has an associated operational amplifier and a power transistor controlled by the operational amplifier, wherein the power transistor has a gate;

a plurality of nodes each of which is associated with a respective one of the inverter outputs; and a plurality of depletion mode transistors, one of which is connected to the gate of the power transistor and some of which are each connected between a respective one of the plurality of nodes and a respective one of the plurality of power supply terminals, wherein the depletion mode transistors each have a gate and wherein the power supply power-on-reset circuit applies power-on-reset control signals to each gate.

8. Power regulator circuitry comprising:

an output at which a regulated output voltage is provided;

a regulated power supply circuit having an associated operational amplifier, having a transistor with a gate that receives an output signal from the operational amplifier, and having a feedback path that connects the output to an input of the operational amplifier; and a switch-based power supply circuit containing at least one transistor coupled between a power supply terminal and the output;

a plurality of depletion mode transistors in the regulated power supply circuit and the switch-based power supply circuit; and power supply power-on-reset control circuitry that applies power-on-reset control signals to the depletion mode transistors in the regulated power supply circuit and the switch-based power-supply circuit.

9. The power regulator circuitry defined in claim 8 further comprising at least one additional depletion mode transistor that is connected between the output and a ground terminal.

10. The power regulator circuitry defined in claim 8 further comprising at least one resistor connected between the output and a ground terminal.

11. The power regulator circuitry defined in claim 8 further comprising first and second additional depletion mode transistors connected between the output and a ground terminal and a resistor connected between the output and a ground terminal.

12. The power regulator circuitry defined in claim 8 further comprising system power-on-reset circuitry that applies a system power-on-reset signal to the power supply power-on-reset circuitry.

13. The power regulator circuitry defined in claim 8 further comprising system power-on-reset circuitry that supplies a system power-on-reset signal, wherein the power supply power-on-reset circuitry contains at least first, second, third, and fourth inverters, each inverter producing an associated one of four power-on-reset signals and wherein the first inverter receives the system power-on-reset signal from the system power-on-reset circuitry.

14. An integrated circuit comprising:

an array of programmable memory elements each of which has a storage element formed from cross-coupled inverters that are powered by a storage element power supply voltage;

programmable logic that is configured by configuration data loaded into the programmable memory elements; and power regulator circuitry, comprising:

an output at which the storage element power supply voltage is provided;

a regulated power supply circuit that is connected to the output;

a switch-based power supply circuit that is connected to the output, that contains at least one node, and that contains at least one depletion mode transistor, wherein the depletion mode transistor is connected between the node and a power supply terminal and has a gate; and power supply power-on-reset control circuitry that applies a power-on-reset control signal to the gate of the depletion mode transistor during power up operations to ensure that the node is maintained at a defined voltage.

15. The integrated circuit defined in claim 14 wherein the switch-based power supply circuit comprises a positive power supply terminal and a digital switch that is connected between the positive power supply terminal and the output, wherein the digital switch has an input and wherein the node is connected to the input.

16. The integrated circuit defined in claim 14 wherein the regulated power supply circuit comprises:

an operational amplifier having first and second signal inputs;

a power transistor having a gate that receives an output signal from the operational amplifier, wherein the transistor has a terminal connected to the output; and a feedback path that connects the output to the first signal input; and a power-on-reset depletion mode transistor connected to the gate of the power transistor, wherein the power-on-reset depletion mode transistor receives a control signal from the power-supply power-on-reset circuitry.

17. The integrated circuit defined in claim 14 wherein the switch-based power supply circuit comprises:

a positive power supply terminal;

a first p-channel metal-oxide-semiconductor transistor that is connected to the positive power supply terminal and that has a first gate;

a second p-channel metal-oxide-semiconductor transistor that is connected between the first p-channel metal-oxide-semiconductor transistor and the output and that has a second gate, wherein the node is connected to the first gate.

18. The integrated circuit defined in claim 14 wherein the switch-based power supply circuit comprises:

a positive power supply terminal;

a first p-channel metal-oxide-semiconductor transistor that is connected to the positive power supply terminal and that has a first gate;

a second p-channel metal-oxide-semiconductor transistor that is connected between the first p-channel metal-oxide-semiconductor transistor and the output and that has a second gate wherein the node is connected to the first gate and wherein an additional depletion mode transistor is connected to the second gate.

19. The integrated circuit defined in claim 14 wherein the switch-based power supply circuit comprises:

a positive power supply terminal;

a pair of p-channel metal-oxide-semiconductor transistors connected in series between the positive power supply terminal and the output;

a digital switch control circuit that generates control signals for the pair of p-channel metal-oxide-semiconductor transistors;

first and second logic gates through which the control signals for the pair of p-channel metal-oxide-semiconductor transistors are routed, wherein the first and second logic gates each have an output; and at least two power-on-reset transistors each connected between a respective one of the outputs of the first and second logic gates and a terminal associated with a power supply voltage, wherein the two power-on-reset transistors receive power-on-reset control signals from the power supply power-on-reset control circuitry.

20. The integrated circuit defined in claim 14 further comprising a system power-on-reset circuit that receives at least two power supply voltages as inputs and that supplies a corresponding system power-on-reset control signal as an output, wherein the power supply power-on-reset control circuitry comprises an input that receives the system power-on-reset signal.

* * * * *